(12) United States Patent
Yamaguchi et al.

(10) Patent No.: US 7,100,369 B2
(45) Date of Patent: Sep. 5, 2006

(54) THERMOELECTRIC GENERATING DEVICE

(75) Inventors: Hiroo Yamaguchi, Toyohashi (JP); Yasutoshi Yamanaka, Kariya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 10/835,231

(22) Filed: Apr. 29, 2004

(65) Prior Publication Data

US 2004/0221577 A1   Nov. 11, 2004

(30) Foreign Application Priority Data

| May 6, 2003 | (JP) | ............................. 2003-128301 |
| May 9, 2003 | (JP) | ............................. 2003-132234 |
| Mar. 26, 2004 | (JP) | ............................. 2004-092699 |

(51) Int. Cl.
*F01N 7/00* (2006.01)

(52) U.S. Cl. ............................. 60/324; 60/275; 60/280; 60/287; 60/292; 60/298; 60/320; 422/173; 422/174; 136/203; 136/204; 136/210; 136/211; 136/212

(58) Field of Classification Search ................ 60/275, 60/278, 280, 287, 288, 289, 291, 292, 298, 60/320, 321, 324; 422/173, 174, 175, 110, 422/115, 176; 136/203, 204, 209, 210, 211, 136/212, 208
See application file for complete search history.

(56) References Cited

U.S. PATENT DOCUMENTS

| 4,753,682 A | * | 6/1988 | Cantoni ........................ 136/212 |
| 4,951,871 A | | 8/1990 | Hata et al. |
| 5,915,472 A | | 6/1999 | Takikawa et al. |
| 5,968,456 A | * | 10/1999 | Parise ........................ 422/174 |
| 6,155,042 A | | 12/2000 | Perset et al. |
| 6,172,427 B1 | * | 1/2001 | Shinohara et al. ........ 290/40 B |
| 6,209,515 B1 | * | 4/2001 | Gotoh et al. ................ 123/305 |
| 6,272,873 B1 | * | 8/2001 | Bass .......................... 62/238.3 |
| 6,510,835 B1 | * | 1/2003 | Mizuno et al. ............. 123/295 |

FOREIGN PATENT DOCUMENTS

| DE | 11 11 460 | | 7/1961 |
| FR | 2 512 499 | | 3/1981 |
| JP | U-63-162916 | | 10/1988 |
| JP | U-6-4317 | | 1/1994 |
| JP | 6-081639 | | 3/1994 |
| JP | 407012009 A | * | 1/1995 |
| JP | 2000-018095 | | 1/2000 |
| JP | 2000-286469 | | 10/2000 |
| JP | 2000-297699 | | 10/2000 |
| JP | 2004068608 A | * | 8/2002 |
| JP | 2004-068608 | | 3/2004 |
| KR | 2003-015361 | | 2/2003 |

OTHER PUBLICATIONS

European Search Report dated Aug. 3, 2004 in corresponding European Patent Application No. 04 01 0454.
European Search Report dated Dec. 22, 2004 in corresponding European Patent Application No. 04 01 0454.

* cited by examiner

*Primary Examiner*—Binh Q. Tran
(74) *Attorney, Agent, or Firm*—Harness, Dickey & Pierce, PLC

(57) ABSTRACT

A thermoelectric generating device has a thermoelectric element which utilizes an exhaust gas from an engine as a high temperature heat source and an engine coolant as a low temperature heat source in order to generate electricity. An introducing passage introduces a part of the exhaust gas passed through the thermoelectric element into an intake of the engine. An introducing valve opens and closes the introducing passage. A controller controls an opening degree of the introducing valve according to a load of the engine.

15 Claims, 11 Drawing Sheets

THERMOELECTRIC GENERATING DEVICE

CROSS REFERENCE TO RELATED APPLICATION

This application is based on Japanese Patent Application No. 2003-128301 filed on May 6, 2003, Japanese Patent Application No. 2003-132234 filed on May 9, 2003 and Japanese Patent Application No. 2004-92699 filed on Mar. 26, 2004 the disclosure of which is incorporated herein by reference.

FIELD OF THE INVENTION

The present invention relates to a thermoelectric generating device which converts a heat energy of an exhaust gas of an engine into an electric energy.

BACKGROUND OF THE INVENTION

A conventional thermoelectric generating device is shown in JP-U-63-162916A. The conventional thermoelectric generating device has a thermoelectric element which utilizes an exhaust gas as a high temperature heat source and an ambient air as a low temperature heat source in order to generate electricity. A bypass pipes branched from an exhaust pipe of an engine through a plurality of branch pipes. Each of the branch pipes has an electric valve which opens and closes the branch pipes. The electric valve closes the bypass pipe respectively when the temperature of the exhaust gas exceeds a predetermined value to control an amount of the exhaust gas flowing in the bypass pipe so that the temperature of the thermoelectric element at the high temperature side is kept under the resisting temperature.

JP-2000-297699A shows another conventional thermoelectric generating device which utilizes an engine coolant as a low temperature heat source.

In the thermoelectric generating device shown in JP-U-63-162916A, an amount of generated current depends on a temperature difference between the exhaust gas and the ambient air when the temperature of the exhaust gas is lower than a predetermined value. Since the temperature difference fluctuates in each situation, there is no technical concept to generate current effectively in a positive way.

In the thermoelectric generating device shown in JP-2000-297699A, since the heat of the exhaust gas is absorbed by the engine coolant, the temperature of the engine coolant may increase over a threshold so that overheating of the engine may be caused. To prevent the overheating, it is necessary to upsize a radiator.

SUMMARY OF THE INVENTION

The present invention is made in view of the foregoing matter and it is an object of the present invention to provide a thermoelectric generating device which utilize an engine coolant as a low temperature heat source and generates maximum electricity according to a load of the engine without upsizing of the radiator.

According to the present invention, a thermoelectric generating device has a thermoelectric element which utilize an exhaust gas of an engine as a high temperature heat source and an engine coolant as a low temperature heat source. The thermoelectric generating device has an introducing passage for introducing a part of the exhaust gas into a suction pipe, a introducing valve for opening and closing the introducing passage, and a controller for controlling the opening degree of the introducing valve.

Accordingly, the thermoelectric element generates an electricity by utilizing the exhaust gas which is re-circulated to the suction pipe with applying a heat to the thermoelectric element according to the load of the engine. Thus, it is unnecessary to provide a heat exchanger particularly only to cool the exhaust gas which is re-circulated into the suction pipe.

BRIEF DESCRIPTION OF THE DRAWINGS

Other objects, features and advantages of the present invention will become more apparent from the following detailed description made with reference to the accompanying drawings, in which like parts are designated by like reference numbers and in which.

DETAILED DESCRIPTION OF EMBODIMENT

First Embodiment

A thermoelectric generating device 100 of the present invention is used for an automobile having a water-cooled engine 10. A thermoelectric element 111 of the device 100 has a function of generating an electricity and a function of cooling an exhaust gas for re-circulation, which is referred to as EGR.

Figure 1:
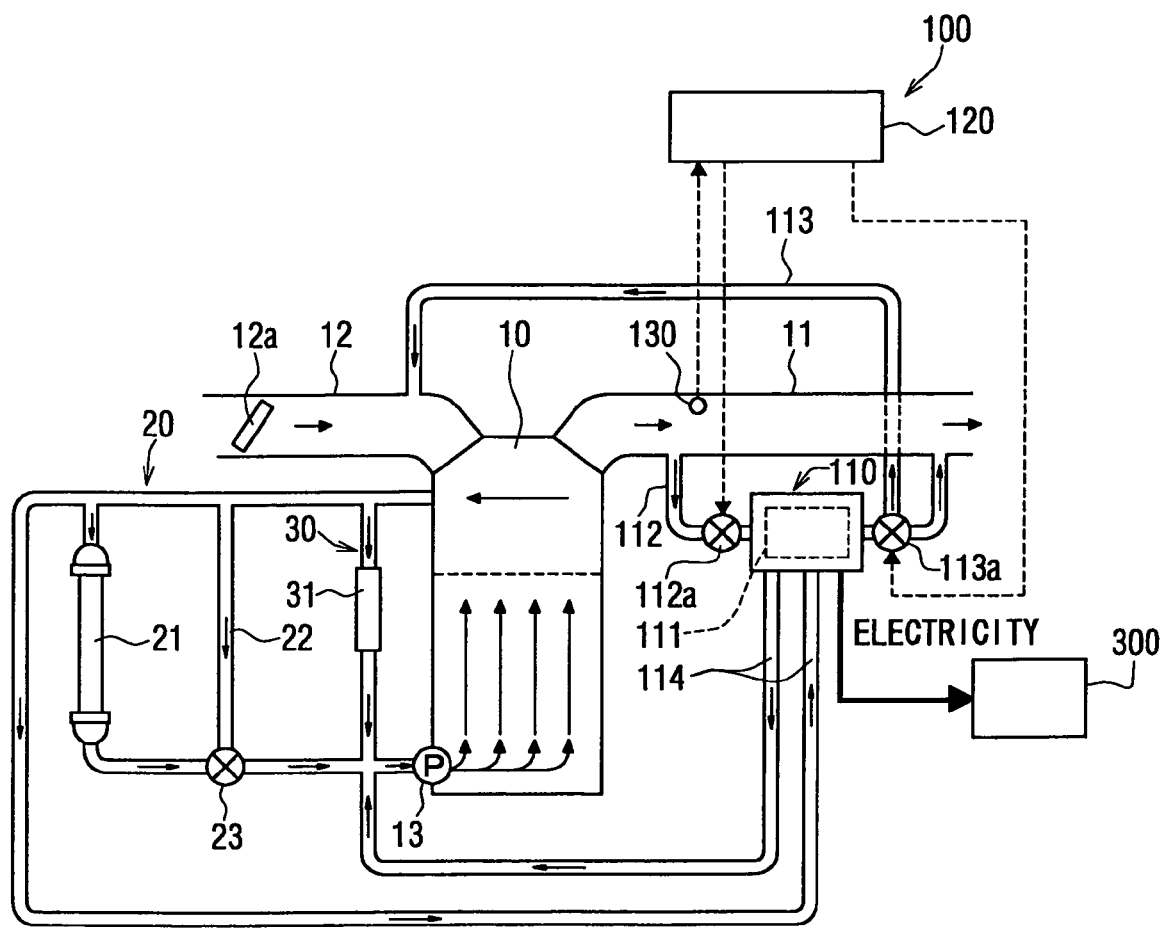
FIG. 1 is a schematic view according to a first embodiment.

Referring to FIG. 1, an engine 10 is provided with an intake pipe 12 for introducing an air for combustion and an exhaust pipe 11 for introducing the exhaust gas. A throttle valve 12a is disposed in the intake pipe 12 which varies an opening degree to adjust an amount of intake air.

The engine 10 is provided with an engine-coolant circuit 20. An engine coolant is circulated in the engine-coolant circuit 20 through a radiator 21 by a water-pump 13. The water pump 13 is driven by the engine 10. The coolant is cooled by the radiator 21 and the temperature of the engine 10 is kept in a proper range. The engine-coolant circuit 20 is provided with a bypass passage 22 and a thermostat 23 which controls the amount of the coolant which flows into the radiator 21 and the bypass passage 22. When the temperature of the coolant is less than a predetermined value (for example 90° C.), the thermostat 23 closes the passage toward the radiator 21 so that the coolant flows in the bypass passage 22 to restrict a super cooling of the coolant. Thereby, a warming up of the engine is expedited when the coolant is in a low temperature.

A heater core 31 is arranged in the engine-coolant circuit 20 in parallel with the radiator 21 which forms the heater circuit 30. The heater core 31 is a heat exchanger for warming an air by a heat derived from the warmed coolant.

The thermoelectric generating device 100 is comprised of a thermoelectric generator 110 and a controller 120, and utilizes the exhaust gas from the engine 10 and the coolant in the engine-coolant circuit 20.

The thermoelectric generator 110 has the thermoelectric element 111 to which a branched passage 112 and a coolant pipe 114 are connected, the element 111 generating the electricity by Seebeck effect.

The branched passage 112 diverges from and converges on the exhaust pipe 11 which is referred to as exhaust passage in the present invention. The exhaust gas flows in the branched passage 112. One side surface of the thermoelectric element 111 is in contact with the branched passage 112. At upstream of the thermoelectric element 111 in the branched passage 112, a branch valve (an electric valve) 112a is disposed.

The coolant pipe 114 diverges from the engine-coolant circuit 20 at upstream from the radiator 21 and is connected with the engine-coolant circuit 20 at upstream from the water-pump 13 through the thermoelectric generator 110. The other side surface of the thermoelectric element 11 is in contact with the coolant pipe 114.

One end of an introducing passage 113 is connected at downstream of the generator 110 in the branched passage and the other end of the introducing passage 113 is connected with the intake pipe 12. An introducing valve 113a is disposed in the branched passage 112 for opening and closing the branched passage 112.

An exhaust gas temperature sensor 130 is disposed in the exhaust pipe 11 to detect the temperature of the exhaust gas, and the sensor 130 outputs the signal indicative of the temperature to the controller 120. The temperature of the exhaust gas represents a characteristic of the load of the engine 10. That is, the lower the temperature of the engine 10 becomes, the lower the load of engine becomes. The higher the temperature of the engine 10 becomes, the higher the load of the engine becomes.

The controller controls the opening degree of the branch valve 112a and the introducing valve 113a according to the signal from the exhaust temperature sensor 130. As the detected temperature is lower, the opening degree of the valves 112a and 113a becomes larger. As the detected temperature is higher, the opening degree of the valve 112a and 113a becomes smaller.

An operation of this embodiment is described hereinafter. The function of generating the electricity is explained as follows.

Under the operation of the engine 10, the fresh air is introduced into intake pipe 12 based on the opening degree of the throttle valve 12a and the introduced air is mixed with a fuel injected by an injector (not shown). The mixed air and fuel is introduced into the combustion chamber and is ignited to be combusted. The exhaust gas is purified by a catalyst (not shown) and is discharged into the air. The engine coolant is circulated in the engine-coolant circuit 20, heater circuit 30, and the coolant pipe 114 by the operation of the water-pump 13.

The controller 120 controls the opening degree of the branch valve 112a and introducing valve 113a according to the signal from the exhaust temperature sensor 130, which is indicative of the temperature of the exhaust gas. When the load of the engine is low and the temperature of the exhaust gas is low, the controller 120 raises the opening degree of the branch valve 112a. Then, amount of an exhaust gas flowing into the branch passage 112 is increased. The thermoelectric element 111 generates the electricity according to the temperature difference between the exhaust gas in the branch passage 112 and the engine coolant in the coolant pipe 114. The generated electricity is charged in a battery and is supplied to devices and systems 300.

As the load of the engine increases and the temperature of the exhaust gas rise, the controller 120 lowers the opening degree of the branch valve 112a. Then, the amount of the exhaust gas flowing into the branched passage 112 is decreased and amount of electricity generated by the thermoelectric element 111 is restrained.

The function of cooling the EGR gas is described herein after.

When the thermoelectric element 111 generates the electricity at the one side of the element 111, the exhaust gas is cooled down at the other side of the element 11 by the coolant flowing in the coolant pipe 114. The cooled exhaust gas flows in the introducing passage 113 toward the intake pipe 12 via the introducing valve 113a.

Such a function described above is almost equal to a function of an EGR system in which the exhaust gas is cooled by a particular heat exchanger and the cooled exhaust gas is introduced into the intake pipe. The temperature of the combustion is lowered and the concentration of $NO_x$ is reduced without deteriorating the performance of the engine 10.

As the temperature of the exhaust gas increases according to the load of the engine 10, the controller 120 lowers the opening degree of branch valve 112a and the introducing valve 113a. Then, the amount of the exhaust gas flowing in the introducing passage 113 decreases, and the cooling function of the EGR gas is restrained.

When the engine 10 is started and the temperature of the exhaust gas is lower than a predetermined value so that the catalyst is not activated, the controller 120 closes the branch valve 112a and stops the generation of the thermoelectric element 111. That is, a decreasing of the exhaust gas temperature is restrained and the catalyst is activated at first.

As described above, in the present invention, it is possible to generate the electricity by the thermoelectric element 111 with utilizing the exhaust gas. Since the exhaust gas flowing in the introducing passage 113 toward the intake pipe 12 is cooled by the thermoelectric element 111 with the coolant flowing in the coolant pipe 114, it is possible to cool the EGR gas without a specific heat exchanger.

A load of an alternator equipped on the engine 10 is reduced by the generation of the thermoelectric element 111. A pumping loss of the engine 10 is also reduced by introducing the exhaust gas into the intake pipe 12. The warming up of the engine 10 is expedited by the coolant in the coolant pipe, the coolant absorbing the heat from the exhaust gas. And it makes possible to reduce the friction loss and to improve a fuel economy figure.

A rising character of the heater core 31 is improved by the coolant absorbing the heat from the exhaust gas.

As the load of the engine decreases, the controller 120 rises the opening degree of the branch valve 112a and the introducing valve 113a. Therefore, the function of generating electricity and the function of cooling the EGR gas are executed at the same time.

When the temperature of the exhaust gas is low and the catalyst is not activated, the controller 12 controls the branch valve 112a into the closed position. The exhaust gas does not flow in the branched passage 112 so that the heat of the exhaust gas is not treated by the thermoelectric element 111. Therefore, the temperature of the exhaust gas does not decrease and the activation of the catalyst is not deteriorated.

Second Embodiment

Figure 2:
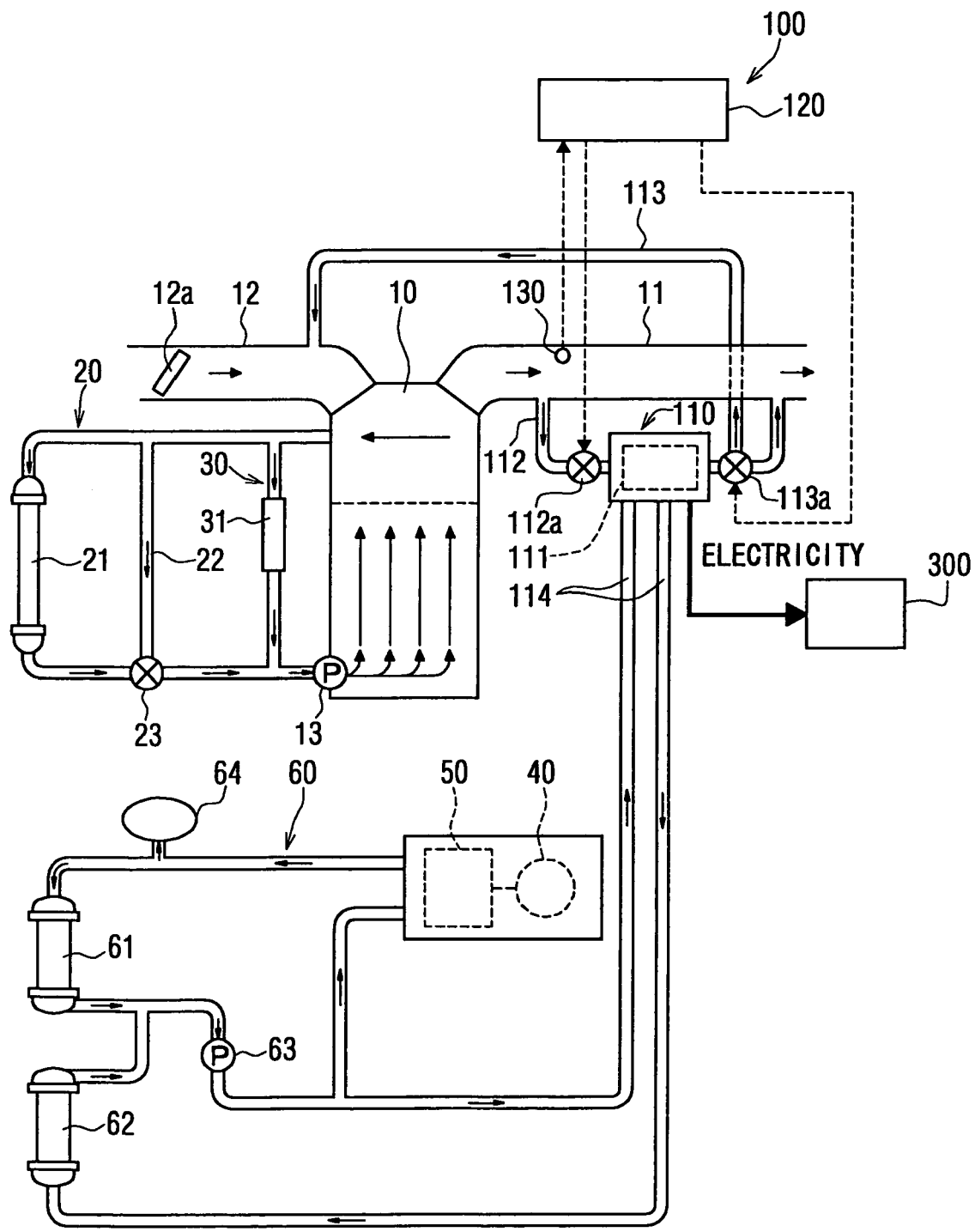
FIG. 2 is a schematic view according to a second embodiment.

FIG. 2 shows a second embodiment. In the second embodiment, the thermoelectric generating device is applied to a hybrid vehicle which includes the engine 10 and a driving motor 40 for driving the hybrid vehicle.

The driving motor 40 is driven with receiving the electricity from the battery and is controlled the rotational speed thereof by an inverter 50. The engine 10 and the driving motor 40 are selectively driven according to the driving condition of the vehicle. The inverter 50, the driving motor 40, and the battery (not shown) are provided with an inverter coolant circuit 60 for cooling components which are under the operation.

The inverter coolant circuit 60 is provided with a radiator 61 and a coolant in the circuit 60 is circulated by an electric pump 63. The coolant pipe 114 is connected with the inverter coolant circuit 60 at positions upstream and downstream from the electric pump 63. A second radiator 62 which radiates the heat absorbed from the exhaust gas is arranged at upstream from the electric pump 63 in the coolant pipe 114. A reservoir 64 for absorbing an expansion and contraction of the coolant is disposed at upstream from the radiator 61 in the circuit 60.

The operation of the second embodiment is substantially the same as the first embodiment. In the second embodiment, the amount of the generated electricity is increased by utilizing the coolant for cooling the inverter 50.

The temperature of the engine coolant is between 90° C. and 110° C. by adjusting capacities of the radiator 21 and the thermostat 23 to operate the engine 10 under a proper condition. The temperature of the inverter coolant is kept around 60° C. to ensure lives of the inverter 50, the driving motor 40 and the battery.

Compared with the first embodiment, the temperature difference between the inverter coolant and the exhaust gas becomes larger. Thus, the amount of the generated electricity in the second embodiment becomes larger than that in the first embodiment.

The radiator 61 and second radiator 62 can be integrated together. Thereby, the number of radiator tanks is reduced, and a dead space between the radiator 61 and the second radiator 62 does not exist. The radiator has a high heat exchanging efficiency and is constructed in a low cost.

In the first and second embodiments, the load condition of the engine 10 is detected by means of the exhaust temperature sensor 130. The load condition of the engine 10 can be detected by detecting a concentration of oxide contained in the exhaust gas or detecting the pressure in the intake pipe 12.

The engine coolant and the inverter coolant can be replaced by the ambient air.

Third Embodiment

In the third embodiment, the same parts and components as those in the first embodiment are indicated with the same reference numerals and same description will not be reiterated.

Figure 3:
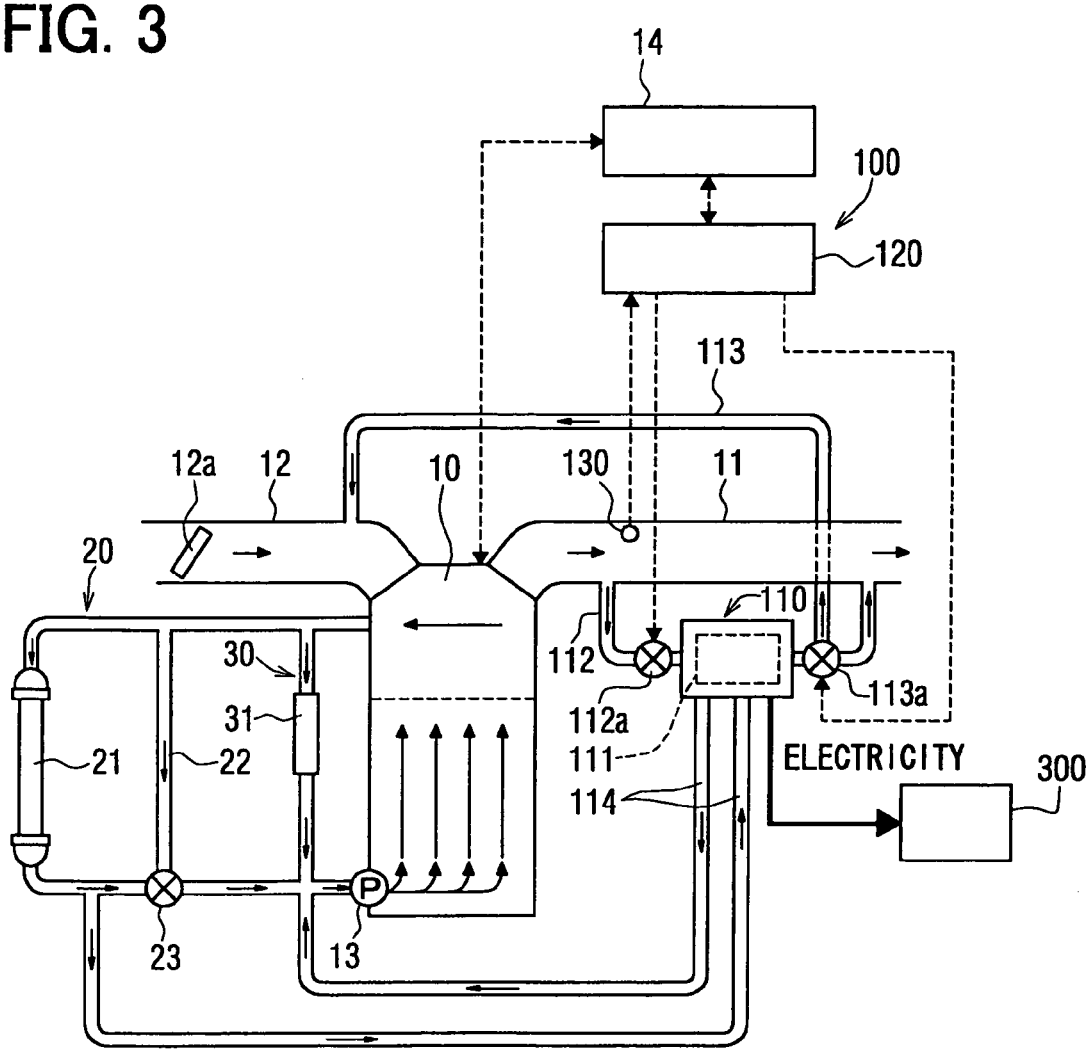
FIG. 3 is a schematic view according to a third embodiment.

Referring to FIG. 3, the engine 10 is controlled by an engine controller 14. The engine controller 14 receives signals such as an engine speed signal, a throttle opening degree signal, a vehicle velocity signal and the like. The engine controller 14 has a map in which an amount of fuel injection is memorized. The amount of fuel injection is based on the engine speed signal and the throttle opening degree signal. The fuel is injected into the intake pipe 12 according to the map. The engine controller 14 sends signals to and receives signals from the controller 120.

The coolant pipe 114 diverges from the engine-coolant circuit 20 at downstream from the radiator 21 and converges on the engine-coolant circuit 20 at upstream from the water-pump 13 through the thermoelectric generator 110. The coolant passed through the radiator 21 flows into the one side surface of the thermoelectric element 111. This coolant is a low temperature heat source for the thermoelectric element 111.

The controller 120 memorizes an axial torque map, a cooling loss map of the engine 10, a coolant amount map of the engine 10, a standard radiation map of the radiator 21, an opening degree map of the branch valve 112a and various equations for calculation. The controller 120 controls the opening degree of the branch valve 112a. The opening degree of the introducing valve 113a is controlled according to the exhaust temperature signal from the exhaust temperature sensor 130.

In this embodiment, variable means is comprised of the branched passage 112, branch valve 112a and the controller 120. The variable means varies the supplying condition of the exhaust gas to the thermoelectric element 111.

The function of the maps and the equations are described hereinafter.

Figure 4:
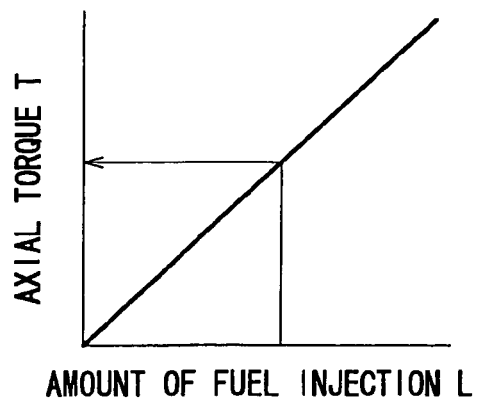
FIG. 4 is an axial torque map.

FIG. 4 is a map showing the relation between the amount of the fuel injection L and the axial torque T. The axial torque T under the operation of the engine is derived from this axial torque map. And the shaft horsepower P is calculated by a following equation based on the axial torque T and an engine speed Ne.

$$\text{Shaft horsepower } P = a \times Ne \times T$$

$$a: \text{constant}$$

Figure 5:
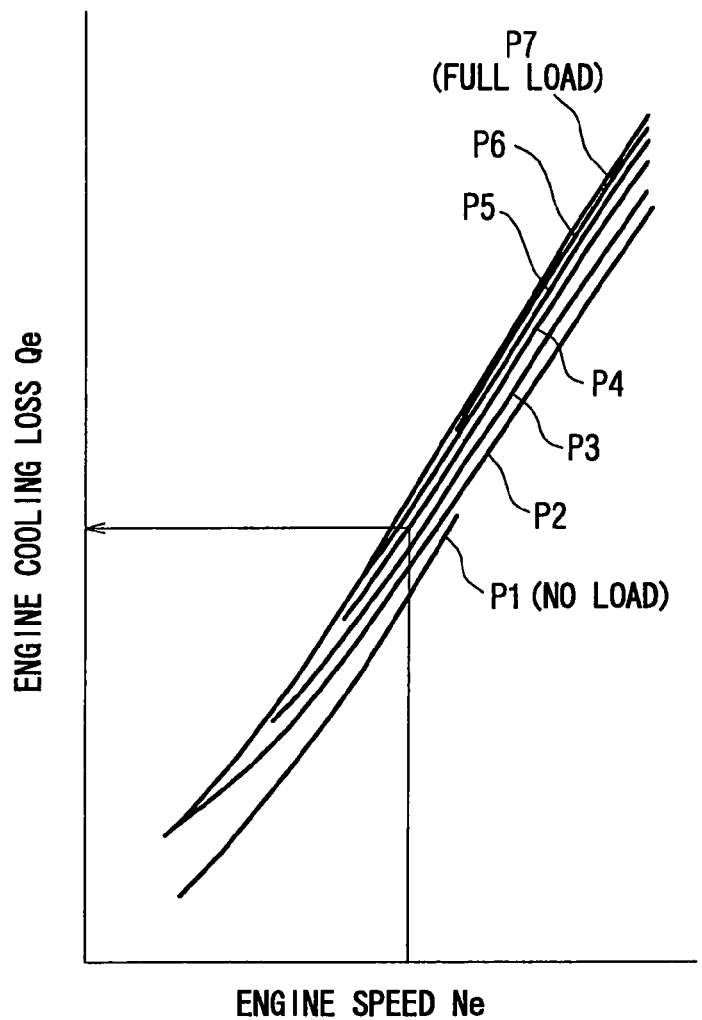
FIG. 5 is a cooling loss map showing relation between the engine speed and the engine cooling loss.

FIG. 5 is the cooling loss map showing the relation between the engine speed Ne and a cooling loss amount Qe of the engine 10. In the cooling loss map, the shaft horsepower P is varied from P1 to P7 as a parameter. When the shaft horsepower P is P1, no load is applied to the shaft. When the shaft horsepower P is P7, full load is applied to the shaft. The cooling loss amount Qe under the operation of the engine 10 is derived from this map. The cooling loss amount Qe is a heat amount radiated by the radiator 21 and is derived by multiplying the whole heat of combustion and the cooling loss coefficient.

Figure 6:
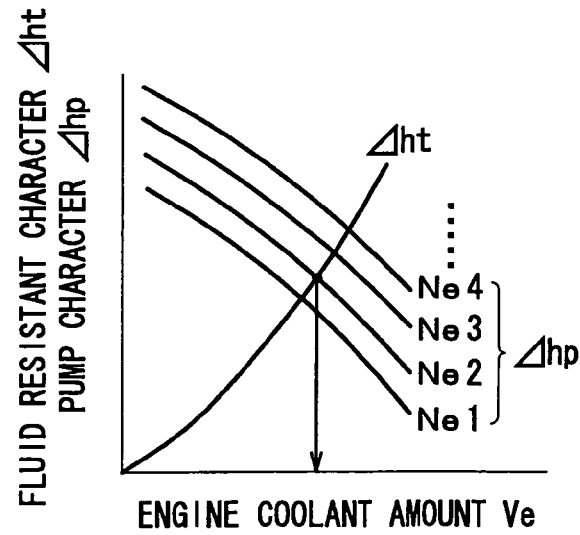
FIG. 6 is a coolant amount map showing a fluid resistant character and a pump character.

FIG. 6 is the coolant amount map to derive the engine coolant amount Ve, in which the engine speed Ne is a parameter. The coolant amount map shows a relation between a water-pump character Δhp, a fluid resistant character Δht, and an engine coolant amount Ve. The engine speed Ne1–Ne4 is in proportion to the speed of the water-pump. The fluid resistant character Δht includes fluid resistance in the engine coolant circuit 20, the heater circuit 30 and the coolant pipe 114.

The amount of coolant Vw flowing through the radiator 21 is calculated from the following equation based on the engine coolant amount Ve.

$$Vw = K \times Ve$$

K is a constant which is derived based on the resistant coefficient of the radiator 21, the bypass passage 22, the thermostat 23, the heater core 31 and coolant pipe 114.

Figure 7:
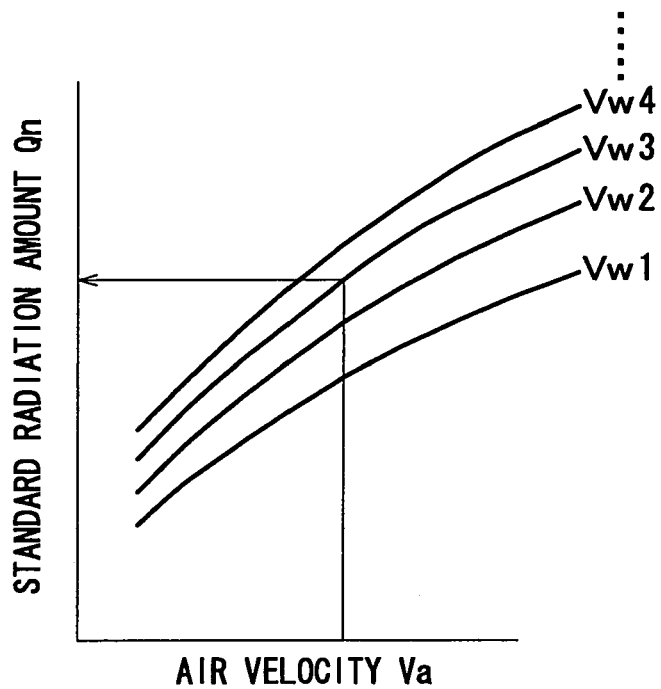
FIG. 7 is a standard radiation map showing a relation between an air velocity Va and the standard radiation amount Qr.

FIG. 7 is the standard radiation map of the radiator 21, in which the amount of coolant Vw flowing through the radiator 21 is a parameter. This map shows a relation between the velocity Va of the air flowing into the front surface of the radiator 21 and a standard radiation amount Qr of the radiator 21 under the operation of the engine. The air velocity Va is calculated based on the vehicle speed V derived by the engine controller 14 with considering the resistance of a bumper and a grille of the vehicle according to the following equation.

$$Va = b \times V$$

"b" is a constant, for example, 1/5.

Figure 8:
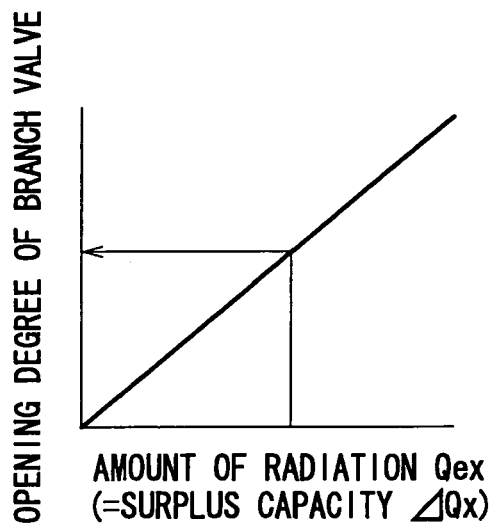
FIG. 8 is an opening degree map showing relation between an amount of a radiation and an opening degree of a branch valve.

FIG. 8 is an opening degree map showing the relation between the radiation amount from the exhaust gas Qex and the opening degree of the branch valve 112a. The radiation amount Qex is equal to the amount of surplus capacity ΔQx of the radiator 21. ΔQx is derived from the following equation.

Surplus capacity ΔQx=Standard radiation amount Qr−Cooling loss amount Qe=Radiation amount from the exhaust gas Qex.

As the radiation amount Qex becomes larger, the opening degree of the branch valve 112a becomes larger.

The operation of the embodiment is described hereinafter.

The controller 120 controls the opening degree of the branch valve 112a according to the maps and aforementioned equations.

Figure 9:
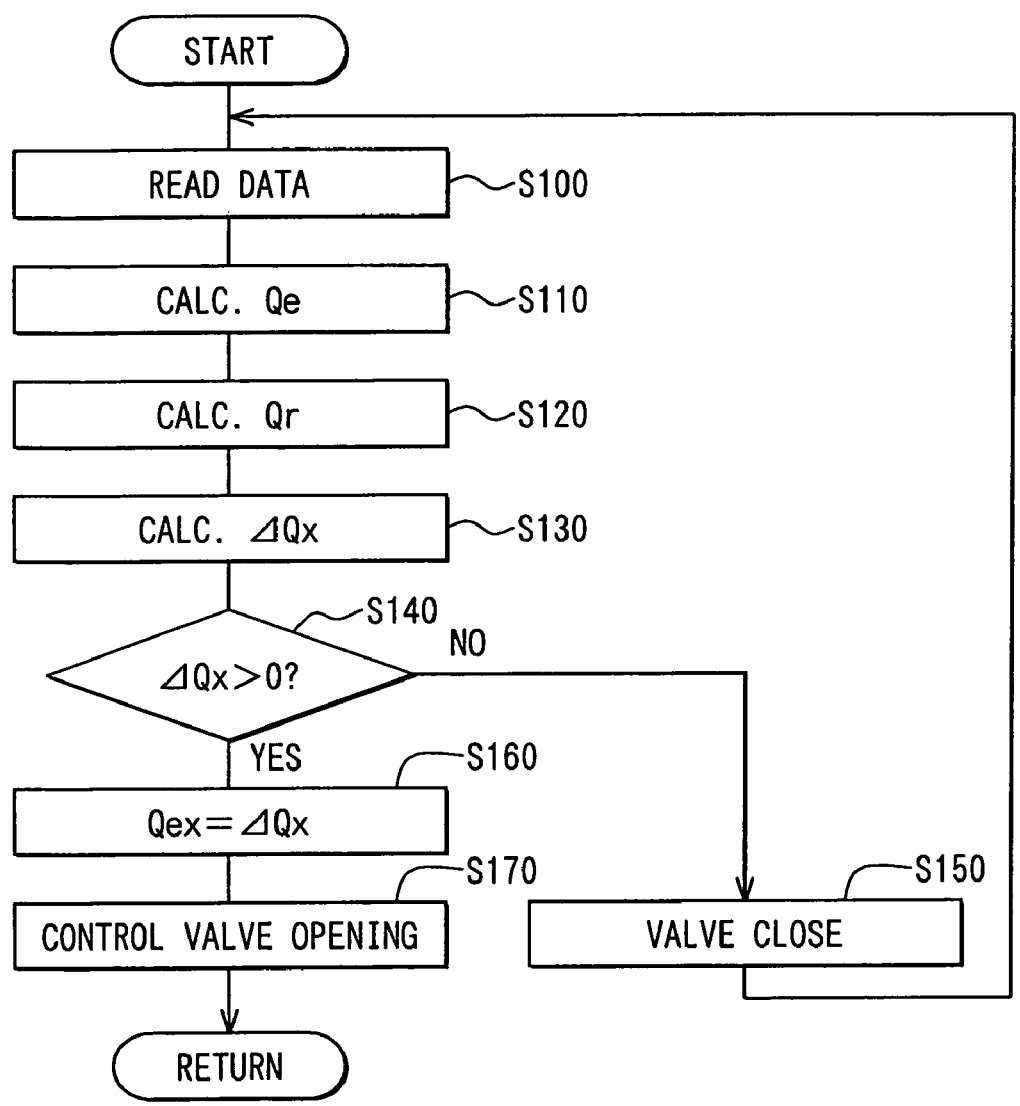
FIG. 9 is a flow chart showing an operation.
Figure 10:
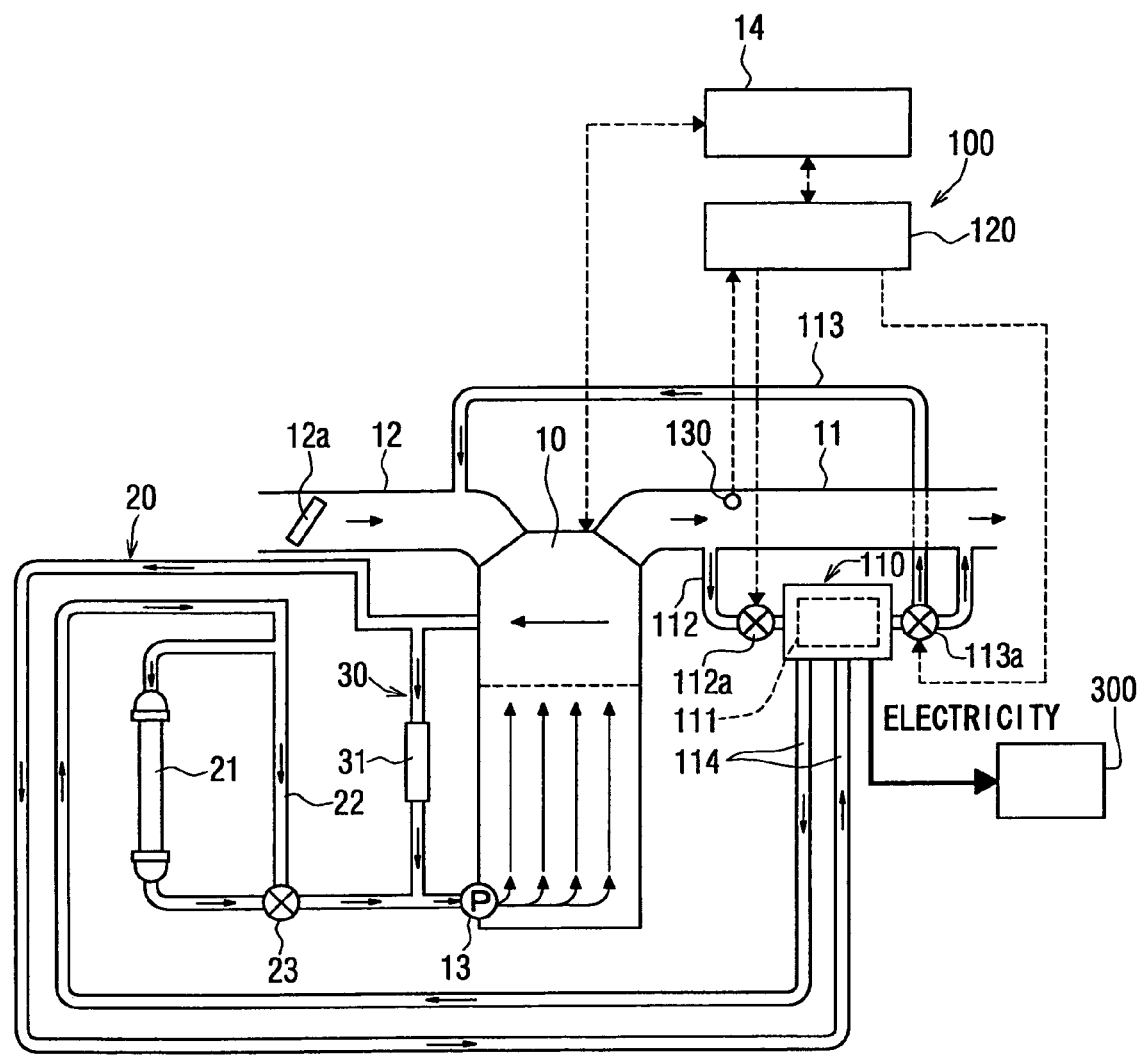
FIG. 10 is a schematic view according to a third embodiment.

FIG. 9 is a flowchart for explaining the operation. In step S100, the data such as the fuel injection amount L, the engine speed Ne, the throttle valve opening degree Bk, vehicle speed V and the like are read. In step S110, the cooling loss amount Qe is calculated. That is, from the axial torque map shown in FIG. 4, the axial torque corresponding to a present amount of fuel injection is derived, and then the shaft horsepower P is calculated with the aforementioned equation. Then, according to the cooling loss map shown in FIG. 5, the cooling loss amount Qe is derived based on the present engine speed Ne and the present shaft horsepower P.

In step S120, the standard radiation amount Qr is calculated. The engine coolant amount Ve is derived from a crossing point of the pump character Δhp and the fluid resistant character Δht at the present engine speed Ne as shown in FIG. 6. The amount of radiator coolant Vw is calculated based on the engine coolant amount Ve. According to the standard radiation map shown in FIG. 7, the standard radiation amount Qr is calculated.

In step S130, surplus capacity ΔQx is calculated based on the cooling loss amount Qe and the standard radiation amount Qr.

In step S140, it is determined whether the surplus capacity ΔQx is more than zero. When it is "NO" in step S140, the branch valve 112a is closed in step S150 and the processing is returned to step S100. In this situation, the load of the engine is highest and the cooling loss amount Qe is radiated in the standard radiation amount Qr. The exhaust gas is not supplied to the thermoelectric element 111 to restrain an elevation of the coolant temperature in coolant pipe 114 and the overheating of the radiator 21.

When it is "Yes" in step S140, the exhaust radiation amount Qex is calculated in step S160. The exhaust radiation amount Qex is established as an equal amount to the surplus capacity ΔQx. When the surplus capacity ΔQx is more than zero, the load of the engine is relatively low and the radiator 21 radiates the cooling loss amount Qe and also have a radiation capacity corresponding to the surplus capacity ΔQx.

In step S170, the opening degree of branch valve 112a is adjusted. As the exhaust radiation amount Qex becomes larger, the opening degree of the branch valve 112a becomes larger, the amount of exhaust gas flowing into the branched passage 112 is increased, and the temperature difference between the coolant in the coolant pipe 114 and exhaust gas becomes larger in order to increase the amount of the generated electricity. The generated electricity is supplied to the battery and other electric components. The coolant absorbs a heat from the exhaust gas, however, the absorbed heat is radiated by the radiator 21 in the surplus capacity thereof.

The controller 120 controls the opening degree of the introducing valve 113a in such a manner that as the exhaust temperature is lower, that is, as the load of the engine is lower, the opening degree of the introducing valve 113a is increased. The exhaust gas is cooled by the coolant in the coolant pipe 114. The cooled exhaust gas flows in the introducing passage 113 through the introducing valve 113a toward the intake pipe 12.

The embodiment described above has a same function of the EGR gas cooling system which includes a particular heat exchanger for cooling the EGR gas so that the combustion temperature is decreased and concentration of $NO_x$ in exhaust gas is reduced.

In this embodiment, since the opening degree of the branch valve 112a becomes larger as the surplus capacity ΔQx of the radiator becomes larger, the heat absorbed by the coolant from the exhaust gas is radiated in the surplus capacity ΔQx. It is possible to generate a maximum electricity by introducing the exhaust gas into the branched passage 112, and a transferred heat from the exhaust gas to the coolant is radiated in the surplus capacity ΔQx of the radiator 21.

Since the thermoelectric element 111 reduces a load of an alternator, a fuel economy of the engine 10 is improved.

The thermoelectric element 111 generates the electricity according to the temperature difference between the exhaust gas and the engine coolant cooled by the radiator.

The coolant pipe 114 can be diverged from the engine coolant circuit 20 at the downstream from the thermostat 23.

As shown in FIG. 8, the coolant pipe 114 can be arranged in a series with the radiator 21.

The introducing passage 113 and the introducing valve 113a can be eliminated according to the horsepower of the engine 10 and the concentration of $NO_x$ in the exhaust gas.

Fourth Embodiment

Figure 11:
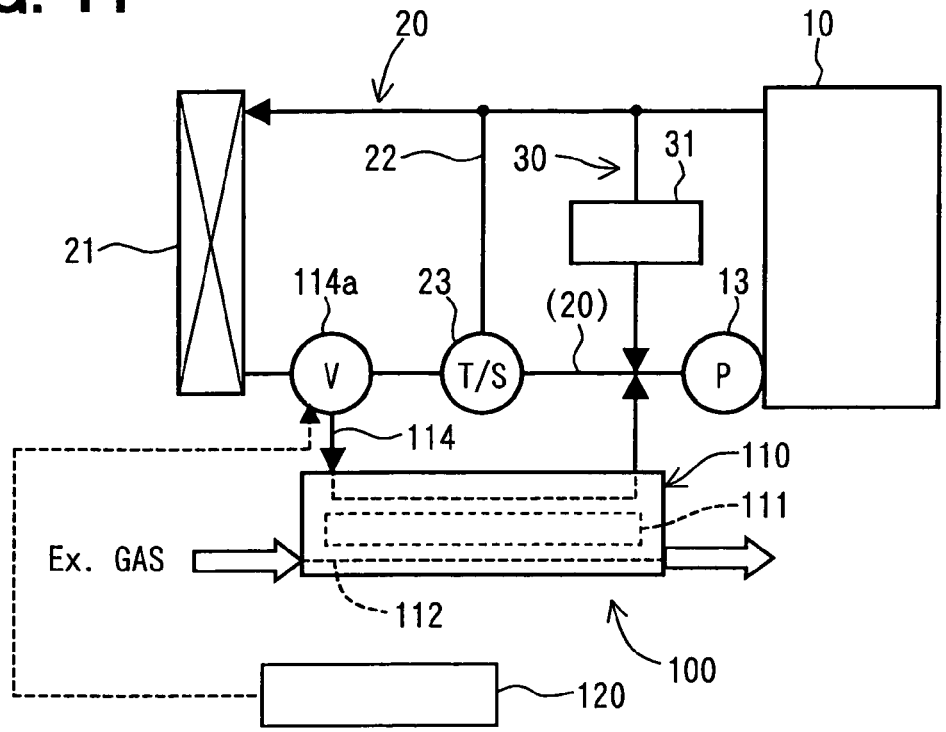
FIG. 11 is a schematic view according to a fourth embodiment.

FIG. 11 shows a fourth embodiment. In this embodiment, the amount of the engine coolant is varied.

A coolant pipe 114 diverges from the engine coolant circuit 20 at downstream from the radiator 21 and converges on the engine coolant circuit 20 at upstream of the water-pump 13.

A fluid control valve 114a is disposed on a diverging point of the coolant pipe 114. The fluid control valve 114a controls the amount of coolant flowing in the engine coolant circuit 20 and in the coolant pipe 114. The opening degree of the fluid control valve 114a is controlled by the controller 120. The variable means for varying the supply condition of the coolant to the thermoelectric element 111 is comprised of the coolant pipe 114, the fluid control valve 114a, and the controller 120.

As the surplus capacity of the radiator 21 increases, the opening degree of the fluid control valve 114a increases so that the amount of the coolant flowing through the coolant pipe 114 increases. Thus, the temperature difference between the coolant and the exhaust gas increases so that the amount of generated electricity is increased.

It is possible to generate a maximum electricity by introducing the coolant into the coolant passage 114, and a transferred heat from the exhaust gas to the coolant is radiated in the surplus capacity ΔQx of the radiator 21.

Fifth Embodiment

Figure 12:
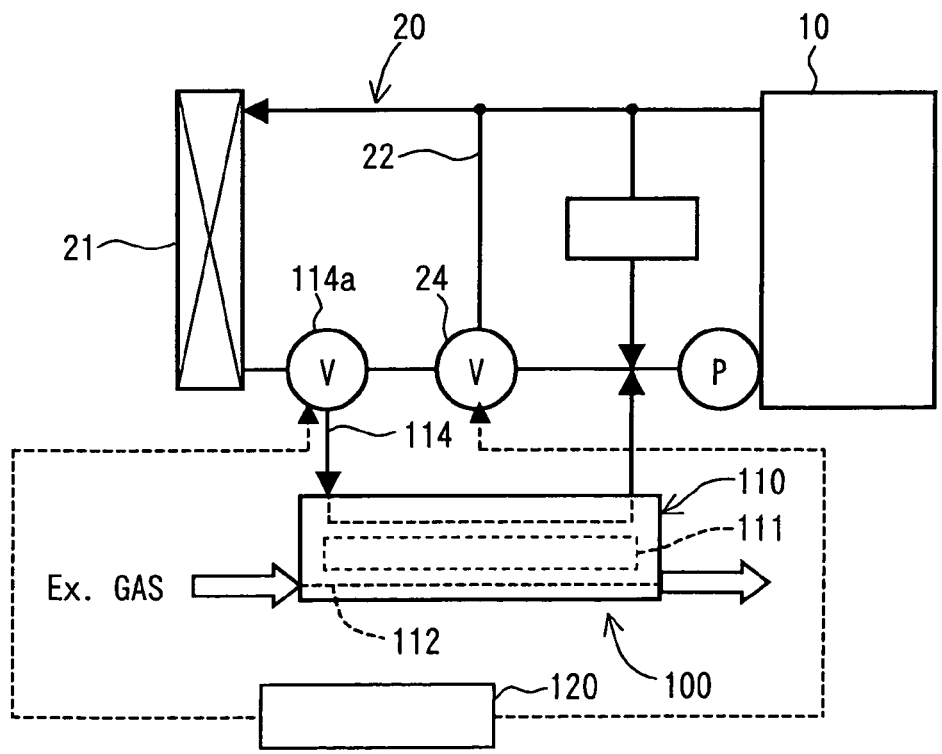
FIG. 12 is a schematic view according to a fifth embodiment.
Figure 13A:
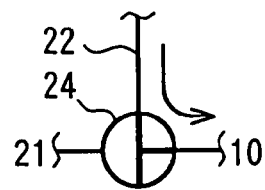
FIG. 13A to 13D are schematic view of a changing valve.
Figure 13B:
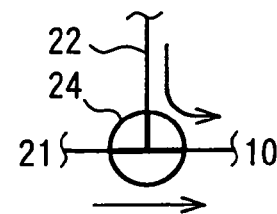
Figure 13C:
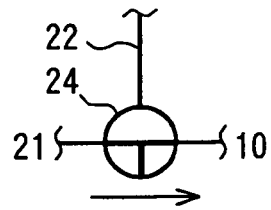
Figure 13D:
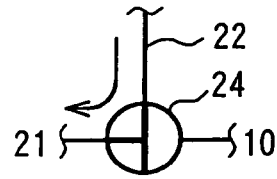
Figure 14:
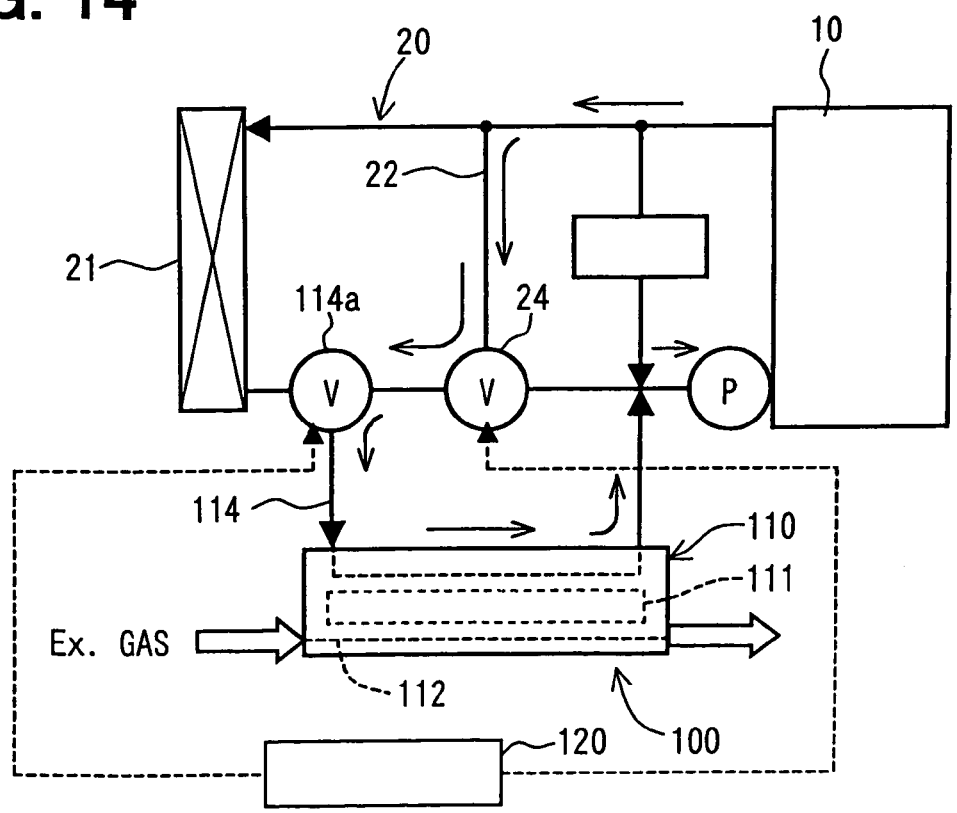
FIG. 14 is a schematic view according to the fifth embodiment.

FIGS. 12–14 shows a fifth embodiment in which the thermostat 23 is replaced by a changing valve 24. The controller 120 controls the opening degree of the changing valve 24.

As shown in FIGS. 13A–13D, the valve body is rotated in four positions by the signal from the controller 120. Three positions shown in FIGS. 13A–13C are conventional positions. The valve head can be positioned as shown in FIG. 13D in which the bypass passage 22 is connected with the radiator 21.

Right after the engine 10 is started, the changing valve 24 is positioned as shown in FIG. 13D and the fluid control valve 114a opens the coolant pipe 114 and the coolant circuit 20. The coolant flows like arrows shown in FIG. 14. Thus, the thermoelectric element 111 generates the electricity and the coolant absorbs a heat generated by the element 111 so that engine 10 is warmed up rapidly. The changing valve 24 controls the flowing of the coolant more precisely than the thermostat 23 so that precise controls of the generation, the warming up and the cooling the engine are executed.

Figure 15:
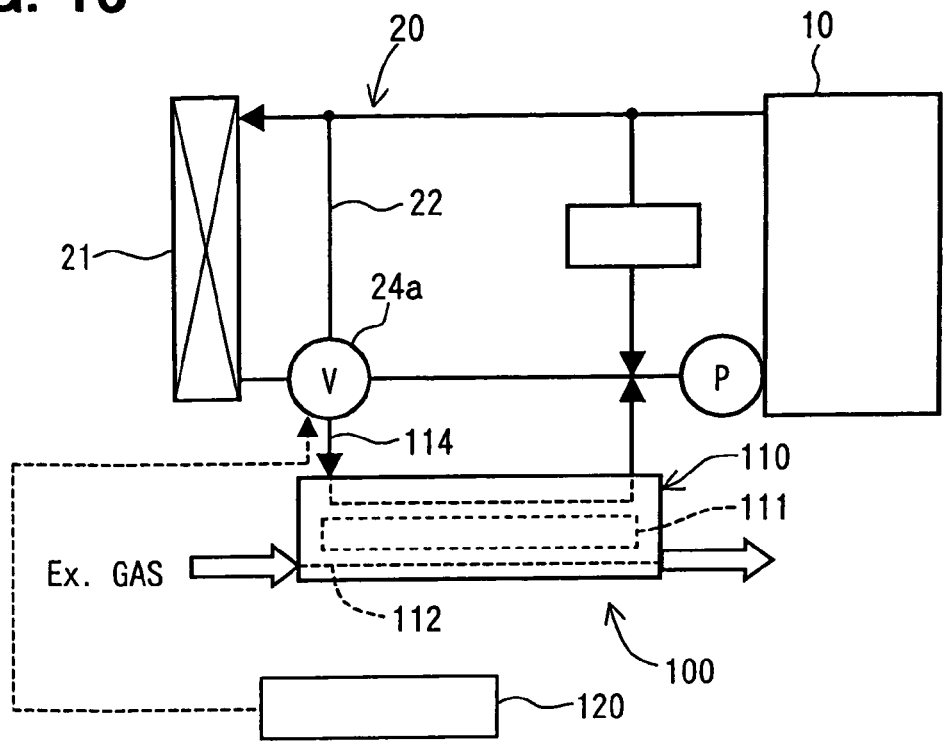
FIG. 15 is a schematic view according to a modification of the fifth embodiment.

FIG. 15 shows a modification of the fifth embodiment. The fluid control valve 114a and the changing valve 24 are integrated into a switching valve 24a. The switching valve 24a has four connecting portions for opening and closing independently. Each of four connecting portions is confronting to the radiator 21, bypass passage 22, the engine 10 and the coolant pipe 114.

Sixth Embodiment

Figure 16:
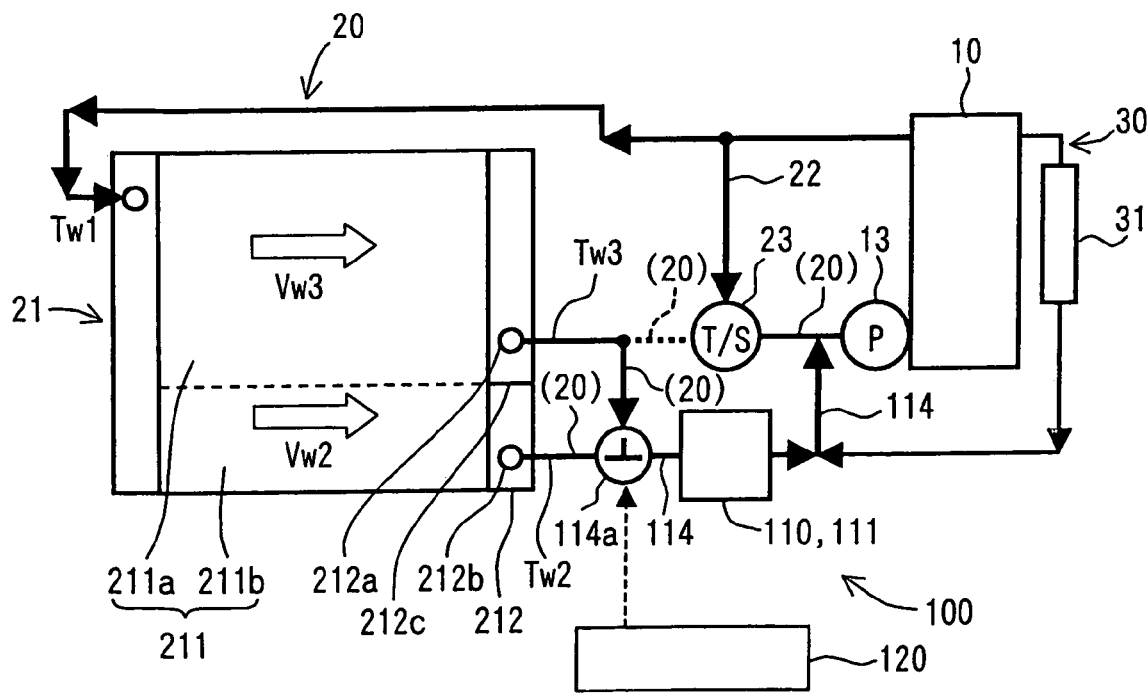
FIG. 16 is a schematic view according to a sixth embodiment.
Figure 17:
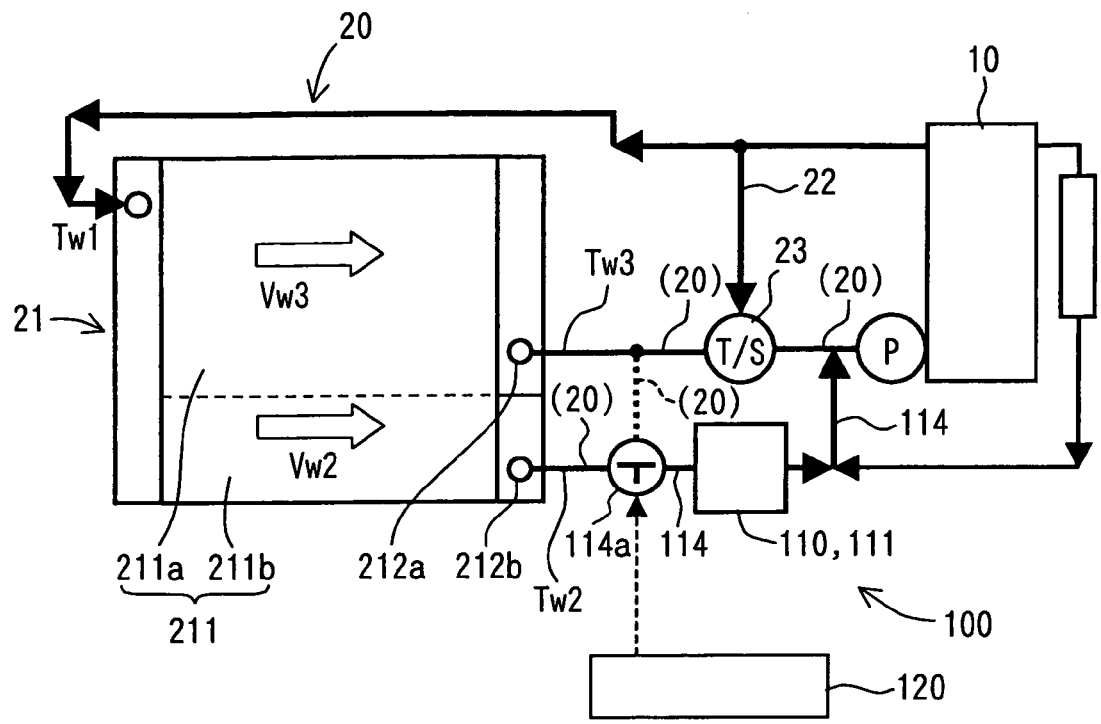
FIG. 17 is a schematic view according to the sixth embodiment.
Figure 18:
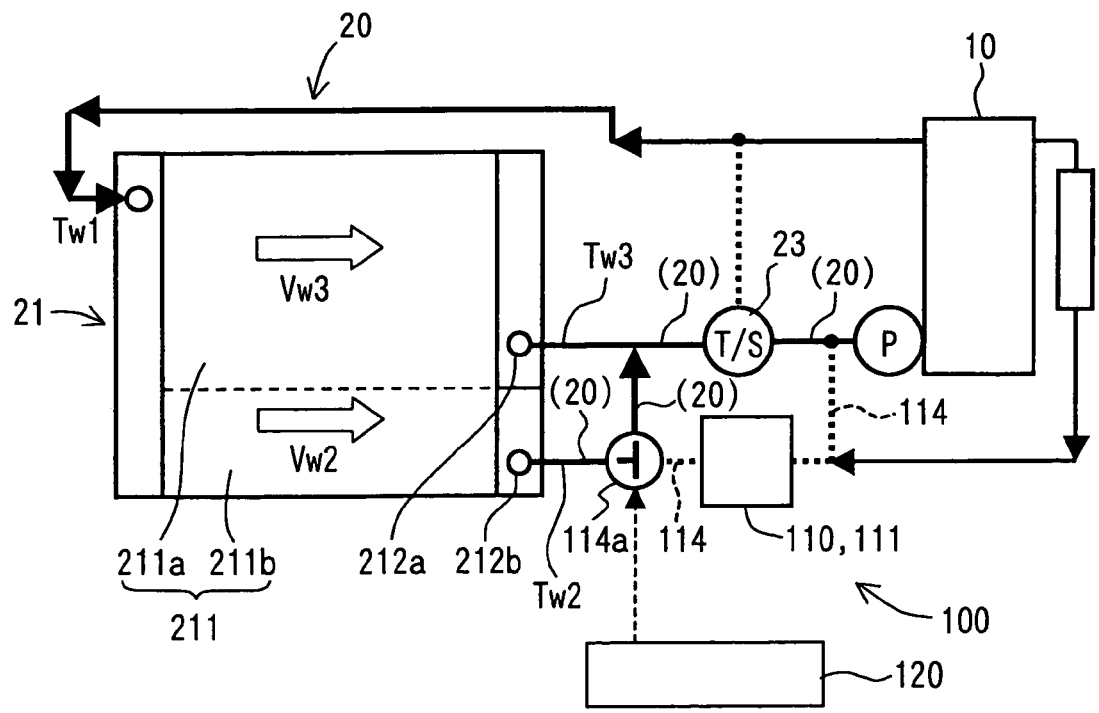
FIG. 18 is a schematic view according to the sixth embodiment.

FIGS. 16–18 show a sixth embodiment. The branched passage 112 is not shown in FIGS. 16–18. In this embodiment, the temperature of the coolant flowing into the thermoelectric element 111 is varied.

As shown in FIG. 16, the radiator 21 is divided into a first radiator 211a and a second radiator 211b.

The first radiator 211a is configured that the radiation performance is maximum when the load of the vehicle is middle band.

An outlet tank of the radiator 21 is provided with a partition 212c at a boundary between the first radiator 211a and the second radiator 211b. The first outlet 212a is provided on the outlet tank 212 corresponding to the first radiator 211a and the second outlet 212b is provided on the outlet tank 212 corresponding to the second radiator 211b. The coolant flowing through the radiator 21 is divided into one flow from the first radiator 211a to the first outlet 212a and the other flow from the second radiator 211b to the second outlet. 212b.

The first outlet 212a is connected with the engine coolant circuit 20 between the fluid control valve 114a and the thermostat 23, and the second outlet 212b is connected with the fluid control valve 114a.

An operation and a function of the embodiment are described hereinafter.

1. In Low Load

When the engine 10 is under the low load, for example, under an idling or an ordinal driving, the temperature of the coolant at the outlet of the engine is relatively low (less than 82° C., for example) so that the thermostat 23 closes the side of the radiator 21 as shown in FIG. 16. The controller 120 controls the fluid control valve 114a to open the side of the engine 10 and the side of the coolant passage 114.

The coolant flowing out from the engine 10 is divided into one flow heading to the bypass passage 22 and the other flow heading to the radiator 21. The coolant flowing out from the bypass passage 22 returns to the engine 10. The coolant flowing out from the radiator 21 flows through the first radiator 211a and the second radiator 211b.

The coolant flowing out from the first radiator 211a through the first outlet 212a flows into the fluid control valve 114a. The coolant flowing out from the second radiator 211b through the second outlet 212b flows into the fluid control valve 114a and returns to the engine 10 through the coolant passage 114. The thermoelectric element 111 generates the electricity.

The coolant is cooled down by the radiator 21 and thermoelectric element 111 is cooled by the coolant of low temperature. Thus the temperature difference between the coolant and the exhaust gas is increased so that sufficient electricity is generated. The coolant is cooled by the radiator 21 and absorbs the heat from exhaust gas through the thermoelectric element 111. A deterioration of the warming up is restrained.

2. In Middle Load

When the engine 10 is under the middle load, the temperature of the coolant at the outlet of the engine 10 is between 82° C. and 100° C. for example. As shown in FIG. 17, the thermostat 23 opens the side of the radiator 21 and the side of the bypass passage 22. The fluid control valve 114a opens the coolant passage 114 according to a signal from the controller 120.

The coolant flowing out from the engine 10 is divided into one stream heading to the bypass passage 22 and the other stream heading to the radiator 21. The coolant flowing out from the bypass passage 22 is returned to the engine 10. The coolant flowing into the radiator 22 flows through the first radiator 211a and the second radiator 211b.

The coolant flowing out from the first radiator 211a through the first outlet 212a returns to the engine 10 through the thermostat 23. The coolant flowing out from the second radiator 211b through the second outlet 212b flows into the fluid control valve 114a and returns to the engine 10 through the coolant pipe 114. The thermoelectric element 111 generates the electricity.

Since the fluid resistance of the coolant pipe 114 is larger than that of the engine coolant circuit 20, the amount of the coolant Vw2 passing through the second radiator 211b is less than the amount of the coolant Vw3 passing through the first radiator 211a. The temperature of the coolant Tw2 at the outlet of the second radiator 211b is less than that of the coolant Tw3 at the outlet of the first radiator 211a. Therefore, the electricity generated by the thermoelectric element 111 is increased.

A sample of the calculation by the inventors is described below.

When the radiator 21 is not divided, the temperature Tw1 of the coolant at the outlet of the engine 10 is 100° C., the amount of the coolant is 40 L/min., the air velocity at the front of the radiator 21 is 3 m/s, and the inlet air temperature of the radiator 21 is 30° C., the temperature of the coolant at the outlet of the radiator 21 is 93° C. The coolant at 93° C. and the exhaust gas at 400° C. are supplied to the thermoelectric element 111, and the element 111 generates the electricity based on the temperature difference 307° C.

When the radiator 21 is divided into the first and second radiator, the amount Vw2 of the coolant passing through the second radiator 211b is 5 L/min. The temperature Tw2 of the coolant flowing out from the second radiator 211b through the second outlet 212b is 82° C. The coolant at 82° C. and the exhaust gas at 400° C. are supplied to the thermoelectric element 111, and the element 111 generates the electricity based on the temperature difference 318° C.

The maximum electricity $E_{max}$ generated by the element 111 is in proportion to the square number of the temperature difference between the temperature TH of the exhaust gas and the temperature TL of the coolant as following equation.

$$E_{max} = \frac{1}{4} \times pf \times (TH-TL)^2$$

"Pf" is a Seebeck coefficient.

3. In High Load

When the temperature of the coolant at the outlet of the engine 10 is high (100° C., for example), the thermostat 23 opens the side of the radiator 21 as shown in FIG. 18. The fluid control valve 114a opens the engine coolant circuit 20 according to a signal from the controller 120.

The coolant flowing out from the engine 10 flows into the radiator 21 and flows through the first radiator 211a and the second radiator 211b.

The coolant flowing out from the first radiator 211a returns to the engine 10 through the first outlet 212a and the thermostat 23. The coolant flowing out from the second radiator 211b returns to the engine 10 through the fluid control valve 114a. In such a construction, since the coolant is not supplied to the element 111, the generation of the electricity is stopped.

In this embodiment, the amount of the coolant supplied to the thermoelectric element 111 is varied, and the temperature of coolant at the outlet of the radiator 21 is decreased according to the load of the engine 10 (surplus capacity ΔQx). Thus, the electricity is generated efficiently.

(Other Modification)

In the third embodiment, the amount of the exhaust gas is controlled. In the fourth through sixth embodiments, the amount or the temperature of the coolant is controlled. The amount of the exhaust gas and the coolant and the temperature of the coolant can be controlled at the same time.

What is claimed is:

1. A thermoelectric generating device including a thermoelectric element generating electricity, utilizing an exhaust gas from an engine of a vehicle as a high temperature heat source, and utilizing a cooling fluid as a low temperature heat source, comprising:
   an introducing passage for introducing a part of the exhaust gas to an intake of the engine;
   an introducing valve for opening and closing the introducing passage;
   a controller for controlling an opening degree of the introducing valve according to a load of the engine;
   a branched passage diverging from and converging on an exhaust pipe; and
   a branch valve of which opening degree is controlled by the controller, the branch valve opening and closing the branched passage; wherein
   the thermoelectric element utilizes the exhaust gas flowing in the branched passage as a high temperature heat source, and
   the opening decree of the branch valve and the introducing valve are increased as the load of the engine is decreased.

2. The thermoelectric generating device according to claim 1, wherein
   the controller controls the opening degree of the branch valve and the introducing valve.

3. The thermoelectric generating device according to claim 1, wherein
   a catalyst is disposed in at least one of the exhaust pipe and the branched passage downstream of the thermoelectric element, the catalyst purifying the exhaust gas, and
   when the controller determines the catalyst is non-active, the branch valve is closed.

4. The thermoelectric generating device according to claim 1, wherein
   the cooling fluid is a coolant for cooling the engine.

5. The thermoelectric generating device according to claim 1, wherein
   the vehicle has an inverter coolant circuit for cooling an inverter which varies a rotational speed of a driving motor and the cooling fluid is a coolant circulating the inverter coolant circuit.

6. A thermoelectric generating device including a thermoelectric element generating electricity, utilizing an exhaust gas from an engine of a vehicle as a high temperature heat source, and utilizing a coolant of the engine as a low temperature heat source, the coolant of the engine being cooled by a radiator, comprising:
   a variable means for varying a supplying condition of at least one of the exhaust gas and the coolant, the variable means increasing the temperature difference between the exhaust gas and the coolant at the thermoelectric element in relation to an increase in a surplus capacity of the radiator, the surplus capacity being derived by subtracting a cooling loss of the engine from a whole capacity of the radiator; and
   a branched passage diverging from an exhaust pine in which the exhaust gas flows, the thermoelectric element being disposed within the branched passage.

7. The thermoelectric generating device according to claim 6, wherein
   the variable means includes a branch valve disposed within the branched passage and a controller for controlling the opening degree of the branch valve,
   the thermoelectric element utilizes the exhaust gas flowing in the branched passage as the high temperature source, and the controller controls the branch valve so that as the surplus capacity of the radiator is increased, the opening degree of the branch valve is increased.

8. The thermoelectric generating device according to claim 6, wherein the variable means includes a branched passage diverged from an engine coolant circuit, a fluid control valve disposed at a diverging point of the branched passage and a controller for controlling an opening degree of the fluid control valve, the fluid control valve controlling the amount of the coolant which flows into the engine coolant circuit and the branched passage, the controller controls the fluid control valve so that as the surplus capacity of the radiator is increased, the fluid control valve opens the branched passage.

9. The thermoelectric generating device according to claim 6, wherein the coolant passed through the radiator works as a low temperature heat source.

10. The thermoelectric generating device according to claim 9, wherein the engine coolant circuit includes a bypass passage which connects an upstream of the radiator and a downstream of the fluid control valve, comprising:

a switching valve for switching between a flow from the converging point to the radiator and a flow from the bypass passage to the engine through the converging point.

11. The thermoelectric generating device according to claim 9, wherein the radiator is divided into a first radiator and a second radiator, a first outlet of the first radiator is connected with a downstream of the fluid control valve, a second outlet of the second radiator is connected with the fluid control valve.

12. The thermoelectric generating device according to claim 1, wherein the thermoelectric element generates electricity by Seebeck effect.

13. The thermoelectric generating device according to claim 1, wherein electricity generated by the thermoelectric element is charged in a battery.

14. The thermoelectric generating device according to claim 1, wherein electricity generated by the thermoelectric element is supplied to components which require electricity.

15. The thermoelectric generating device according to claim 1, further comprising:

a heater core for heating air passing there through and arranged in parallel with the radiator.

* * * * *